(12) United States Patent
Bhat et al.

(10) Patent No.: US 12,257,812 B2
(45) Date of Patent: Mar. 25, 2025

(54) CRYSTAL STRUCTURES INSPIRED TESSELLATIONS TO GENERATE MULTI-MATERIAL PROPERTIES IN LATTICE STRUCTURES WITH 3D PRINTING

(71) Applicant: National Taiwan University of Science and Technology, Taipei (TW)

(72) Inventors: Chinmai Bhat, Taipei (TW); Ajeet Kumar, Taipei (TW); Jeng-Ywan Jeng, Taipei (TW)

(73) Assignee: National Taiwan University of Science and Technology, Taipei (TW)

( * ) Notice: Subject to any disclaimer, the term of this patent is extended or adjusted under 35 U.S.C. 154(b) by 435 days.

(21) Appl. No.: 17/676,023

(22) Filed: Feb. 18, 2022

(65) Prior Publication Data

US 2023/0264450 A1 Aug. 24, 2023

(51) Int. Cl.
| | |
|---|---|
| *A42B 3/12* | (2006.01) |
| *A43B 13/18* | (2006.01) |
| *B22F 5/00* | (2006.01) |
| *B32B 3/12* | (2006.01) |
| *B33Y 80/00* | (2015.01) |
| *B62J 1/26* | (2006.01) |
| *C30B 29/10* | (2006.01) |
| *C30B 29/66* | (2006.01) |

(Continued)

(52) U.S. Cl.
CPC ............... *B32B 3/12* (2013.01); *B22F 5/00* (2013.01); *B33Y 80/00* (2014.12); *C30B 29/10* (2013.01); *C30B 29/66* (2013.01); *F16F 1/025* (2013.01); *F16S 5/00* (2013.01); *A42B 3/063* (2013.01); *A42B 3/125* (2013.01); *A43B 13/181* (2013.01); *A43B 13/188* (2013.01); *B32B 2307/56* (2013.01); *B32B 2437/02* (2013.01); *B32B 2437/04* (2013.01); *B32B 2601/00* (2013.01)

(58) Field of Classification Search
CPC ... B32B 3/12; B32B 2307/56; B32B 2437/02; B32B 2437/04; B32B 2601/00; F16F 1/025; B33Y 80/00; A42B 3/063; A42B 3/124; A42B 3/125; F16S 5/00; B22F 3/1115; B22F 5/00; B22F 5/10; C30B 29/10; C30B 29/66
See application file for complete search history.

(56) References Cited

U.S. PATENT DOCUMENTS

2021/0195989 A1* 7/2021 Iwasa .................. A43B 7/1415

* cited by examiner

*Primary Examiner* — Yan Lan

(57) ABSTRACT

The metallic crystal structures inspired edge-to-edge tessellations and a tessellation based lattice structures are disclosed. In accordance with an exemplary embodiment of the invention, basic unit lattice cells are stacked and connected to constitute a three-dimensional tessellations, wherein each of the basic unit lattice cells comprises a multiple flat connecting portions formed on a surface of the basic unit lattice cell and intersecting with a multiple of axes intersecting in a center of the basic unit lattice cell, and the flat connecting portions of one of the basic unit lattice cell is connected to the flat connecting portions of the adjacent basic unit lattice cell to constitute a connection structure of edge-to-edge tessellation. The formed tessellations are periodically tessellated in a design domain to form different tessellated lattice structures. The Functionally Tessellated (FT) lattice structures composed of different tessellations by interlocking into each other are also disclosed.

11 Claims, 17 Drawing Sheets

(51) Int. Cl.
*F16F 1/02* (2006.01)
*F16S 5/00* (2006.01)
*A42B 3/06* (2006.01)

CRYSTAL STRUCTURES INSPIRED TESSELLATIONS TO GENERATE MULTI-MATERIAL PROPERTIES IN LATTICE STRUCTURES WITH 3D PRINTING

FIELD OF THE INVENTION

The present invention relates to the design of basic unit lattice cells of lattice structures based on the coordination number and inspired by urchin, and more particularly to a three-dimensional tessellation of basic unit lattice cells, inspired by the atomic/molecular arrangements in cubic metallic crystal structures. The tessellations are based on the edge-to-edge connectivity and named accordingly as Simple Cubic (SC), Body Centered Cubic (BCC) and Face Centered Cubic (FCC) tessellations. The basic unit lattice cells of these tessellations are designed with necessary surfaces based on coordination number (CN: number of nearest neighboring elements) for close packing. The designed tessellations propagate in design domain to generate tessellation-based lattice structures namely: Simple Cubic (SC) lattice structure, Body Centered Cubic (BCC) lattice structure and Face Centered Cubic (FCC) lattice structure. The present invention also relates to the method for generation of Functionally Tessellated (FT) lattice structure that may combining SC and/or BCC and/or FCC lattice structures.

Description of the Related Art

The additive manufacturing technology can fabricate lattice structures with complex designs and closed geometric tolerances. Various surface-based lattice structures are used for different structural and functional applications. Different lattice structures deliver different structural and functional properties based on the design of basic unit lattice cell and lattice structure. However, for the applications demanding multi-structural and multi-functional properties such as strength and flexibility, either multi-morphology lattice structures (hybrid structures) or multi-material lattice structures are used. However, for the existing multi-morphological lattice structures, structural integrity is very poor at interface due to two different morphologies. The abrupt transition from one morphology to another result in fewer material and poor transition at interface. This would induce excessive stress concentration due to which, structures exhibit poor structural and functional performance. In addition, the existing multi-material lattice structures have a problem of poor bonding properties at the joint. Therefore, such a multi-material lattice structure usually needs to be made of materials with similar properties.

In addition to the above-mentioned existing challenges, fabrication of these structures using current additive manufacturing technologies such as fused filament fabrication, material jetting, binder jetting, vat photopolymerization and selective laser melting is challenging due to excessive support requirement at the locations of overhanging. The support structures need to be additionally designed based on the fabrication technique and design of lattice structure, thus complicating the design procedure. Involving more complex support structures would incur additional cost of manufacturing by consuming more material, energy and fabrication time. In some complex structures, it is even more difficult to remove the support structures completely.

Therefore, it is expected to develop lattice structures that can deliver independent multi-material like properties such as strength and flexibility using single material along with excellent interface strength. Moreover, the lattice structures are expected to be designed with supportless features that would be easy to fabricate using existing additive manufacturing technologies.

BRIEF SUMMARY OF THE INVENTION

An objective of the present invention is to provide a tessellation based design of basic unit lattice cells, tessellated lattice structures and Functionally Tessellated (FT) lattice structures thereof, which solves the problem of poor structural and functional properties occurring at the interface of the multi-morphological lattice structure and multi-material lattice structure. All the designs of this invention can be additively manufactured without any supports, thereby reducing the time, energy and material for manufacturing. Moreover, each tessellated lattice structure provides different structural and functional properties, thereby delivering multi-material like behavior. The structural simplicity of these designs allows them to be manufactured using metals, resins, soft and rigid polymers.

The invention provides a cubic metallic crystal structure inspired tessellations namely Simple Cubic (SC) tessellation, Body Centered Cubic (BCC) tessellation and Face Centered Cubic (FCC) tessellation. Each tessellation in accordance with an exemplary embodiment of the invention includes a plurality of Urchin inspired basic unit lattice cells stacked and connected to constitute a three-dimensional tessellation. The spherical shaped basic unit lattice cells, designed for the tessellations, comprises of plurality of flat connecting portions formed on a surface of basic unit lattice cell and intersecting with a plurality of axes intersecting in a center of the basic unit lattice cell. The flat connecting portion of one of the basic unit lattice cell is connected to the flat connecting portions of the adjacent basic unit lattice cell to constitute a connection known as edge-to-edge tessellation.

In another exemplary embodiment, the flat connecting portions of SC basic unit lattice cell intersect with three mutually orthogonal axes, and forms a three-dimensional SC tessellation.

In yet another exemplary embodiment, the flat connecting portions of BCC basic unit lattice cell intersect with four axes corresponding to four diagonal lines of a cube in which the basic unit lattice cell is located, and forms a three-dimensional BCC tessellation.

In another exemplary embodiment, the flat connecting portions of FCC basic unit lattice cell intersect with six axes corresponding to four lines connecting the centroid of a rectangle surface of a rectangle cube where the basic unit lattice cell is located and the centroids of the other four adjacent rectangle surfaces of the rectangle cube, and two diagonal lines of the rectangle surface where the basic unit lattice cell is located, and forms FCC tessellation.

In yet another exemplary embodiment, the basic unit lattice cells of SC, BCC and FCC tessellations are hollow, and each of the basic unit lattice cell further comprises a plurality of through holes formed on at least one of the connecting portions. The plurality of through holes may be closed with membrane/skin of desired thickness to form closed basic unit lattice cells. The closed basic unit lattice cells may be filled with secondary materials such as liquids, gels, solid powders to enhance the properties. The closed basic unit lattice cells may be tessellated in the same way as explained.

In another exemplary embodiment, the basic unit lattice cell has a height h defined by a distance from one end thereof to another opposite end thereof, and the height h ranges from 2 mm to 30 mm, and the spherical member has a thickness t defined by a distance from an outer surface thereof to an inner surface thereof, and the thickness t ranges from 0.2 mm to 10 mm.

In yet another exemplary embodiment, each of the basic unit lattice cells has identical mechanical or/and functional properties as the adjacent basic unit lattice cells or has different mechanical or/and chemical or/and functional properties from the adjacent basic unit lattice cells.

The invention provides a tessellation based additive manufacturing lattice structures. The tessellation based additive manufacturing lattice structures in accordance with an exemplary embodiment of the invention includes a plurality of SC tessellation, BCC tessellation and FCC tessellation stacked and propagated to constitute a three-dimensional stacking structure, wherein each of the tessellations comprises a plurality of basic unit lattice cells stacked and connected based on principles of close packing, wherein each of the basic unit lattice cells comprises a plurality of flat connecting portions formed on a surface of the basic unit lattice cells and intersecting with a plurality of axes intersecting in a center of the basic unit lattice cell, and the flat connecting portions of one of the basic unit lattice cells is connected to the flat connecting portions of the adjacent basic unit lattice cells to constitute a connection structure of edge-to-edge tessellation.

In another exemplary embodiment, the three-dimensional lattice structure is a simple cubic packing structure, a body-centered cubic packing structure or a face-centered cubic packing structure.

In yet another exemplary embodiment, the different tessellations comprises a first tessellated structure and a second tessellated structure stacked and tessellated with the first tessellated structure, wherein the first tessellated structure is a simple cubic packing structure, a body-centered cubic packing structure or a face-centered cubic packing structure, and the second tessellated structure is a simple cubic packing structure, a body-centered cubic packing structure or a face-centered cubic packing structure.

In yet another exemplary embodiment, the first tessellated structure and the second tessellated structure have different mechanical or/and chemical or/and functional properties.

The different tessellated lattice structures of the invention have a connection structure of edge-to-edge tessellation, which is constituted by a plurality of basic unit lattice cells mutually stacked and connected, whereby the flat connecting portions of the connected basic unit lattice cells can subject the compression stress or shear stress caused by a load exerted on the lattice structure. According to the spatial geometric arrangement of spherical objects in a cube lattice, the lattice structure is a simple cubic packing structure, a body-centered cubic packing structure or a face-centered cubic packing structure.

Moreover, different tessellated lattice structures of the simple cubic packing structure, the body-centered cubic packing structure, and the face-centered cubic packing structure can be stacked and tessellated to constitute an interlocked structures known as 'functionally tessellated lattice structures, for example, the combination of the simple cubic packing structure and the body-centered cubic packing structure, the combination of the body-centered cubic packing structure and the face-centered cubic packing structure, the combination of the simple cubic packing structure and the face-centered cubic packing structure, or the combination of simple cubic packing structure, body-centered cubic packing structure and the face-centered cubic packing structure. The different tessellated lattice structures (the simple cubic packing structure, the body-centered cubic packing structure, or the face-centered cubic packing structure) can be applied in different portions of a product for different structural and functional requirements. The connection of different tessellated lattice structures can be accomplished by the engagement of the basic unit lattice cell with the cavity portions formed by multiple basic unit lattice cells, wherein one of the basic unit lattice cell of one tessellation engages the cavity portion of another adjacent tessellation. Therefore, the different tessellated lattice structures can be firmly interlocked, and the interface therebetween shows excellent structural and functional properties to prevent the stress concentration problem.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Since the discontinuity and poor structural and functional properties appear at the interface of multi-morphology and multi-material lattice structures, the tessellation based lattice structures are designed. Along with solving the interface related problems, the different tessellated lattice structures also deliver different structural and functional properties resembling different material behavior. The different tessellations of the present invention is constituted by basic unit lattice cells with spherical outlines of same dimension. Due to the same dimensions followed, different tessellations can be stacked and propagated one above the other to generate multi-structural, multi-functional properties. Moreover, all tessellation based lattice structures can be printed without any supports thereby increasing the printing efficiency by reducing printing time, energy and Different tessellations constituted by stacked basic unit lattice cells of the present invention and different tessellation lattice structures constituted by SC, BCC and FCC tessellations of the present invention are described as follows.

Referring to FIGS. 1, 2, 3 and 4, the first embodiment of a basic unit lattice cell of the present invention, the first embodiment of a tessellation named as 'Simple Cubic (SC)' tessellation of the present invention, and the first embodiment of a Simple Cubic (SC) tessellated lattice structure of the present invention are disclosed.

Figure 1:
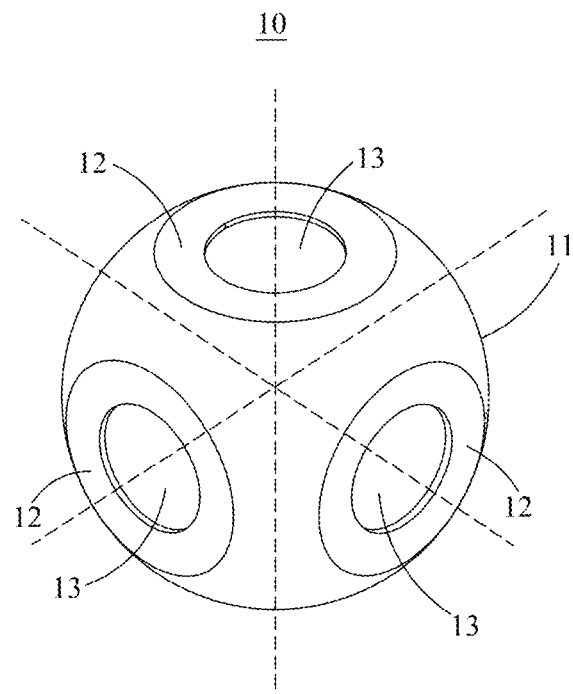
FIG. 1 is a perspective view of the first embodiment of a basic unit lattice cell of Simple Cubic (SC) tessellation of the present invention.
Figure 2:
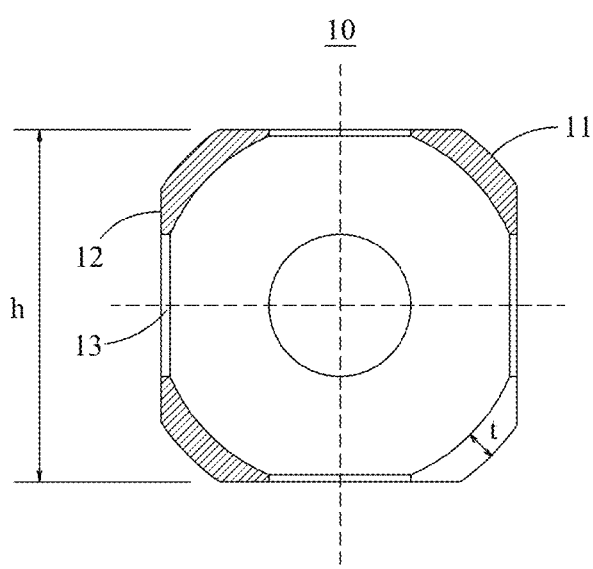
FIG. 2 is a cross section of the basic unit lattice cell of FIG. 1.

As shown in FIG. 1, the basic unit lattice cell 10 of the present embodiment includes a spherical body 11 and multiple flat connecting portions 12 designed on the surface of the spherical body 11. The flat connecting portions 12 are planes formed on the spherical surface of the spherical body 11. The flat connecting portions 12 are intersected with three mutually orthogonal axes respectively, and that is the three mutually orthogonal axes extend through the flat connecting portions 12. Each axis extends through center of two opposite flat connecting portions 12. Therefore, the spherical member 10 of the present embodiment has totally six flat connecting portions 12. The spherical body 11 of the basic lattice unit cell 10 is hollow, and the spherical member 10 further includes through holes 13 formed on the flat connecting portions 12 respectively. In the present embodiment, each flat connecting portion 12 has a through hole 13. However, the through holes can be replaced with membranes of different thickness to close the basic unit lattice cell. Such closed unit lattice cells can be used in filling secondary filler materials (solid powders, liquid, gels, gas) to develop multi-material lattice structures. As shown in FIG. 2, the basic unit lattice cell 10 has a height h defined by a distance from one end thereof to another opposite end thereof, and the height h ranges from 2 mm to 30 mm, i.e. 2 mm≤h≤30 mm. The basic unit lattice cell 10 has a thickness t defined by a distance from an outer surface thereof to an inner surface thereof, and the thickness t ranges from 0.2 mm to 10 mm, i.e. 0.2 mm≤t≤10 mm.

Figure 3:
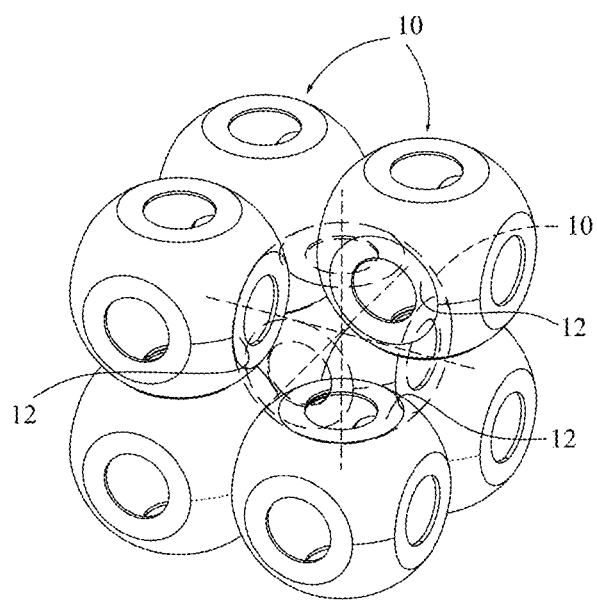
FIG. 3 is a perspective view of the first embodiment of Simple Cubic (SC) tessellation of the present invention constituted by the basic unit lattice cell of FIG. 1.

As shown in FIG. 3, a multiple of basic unit lattice cell 10 of the present embodiment are stacked and tessellated to constitute a Simple Cubic (SC) tessellation 100. As described above, each basic unit lattice cell 10 has flat connecting portions 12 intersecting with three mutually orthogonal axes. The flat connecting portions 12 of one basic unit lattice cell 10 is connected to the flat connecting portions 12 of an adjacent basic unit lattice cell 10, whereby the two basic unit lattice cells 10 are connected to constitute a connection structure of edge-to-edge tessellation. In the present embodiment, each basic unit lattice cell 10 is connected to six adjacent basic unit lattice cells 10 to constitute a lattice-like additive manufacturing unit structure 100 of a simple cubic packing structure. The length of the SC tessellation is equal to the two times diameter of the basic unit lattice cell 10. The connection structure of the basic unit lattice cell 10 provides a larger connection area with the flat connecting portions 12 to enhance the strength of the connection interface. The size of the connection portions can be varied ranging from 0 mm (i.e. closed cells) to 'diameter of basic unit lattice cell 10.

Figure 4:
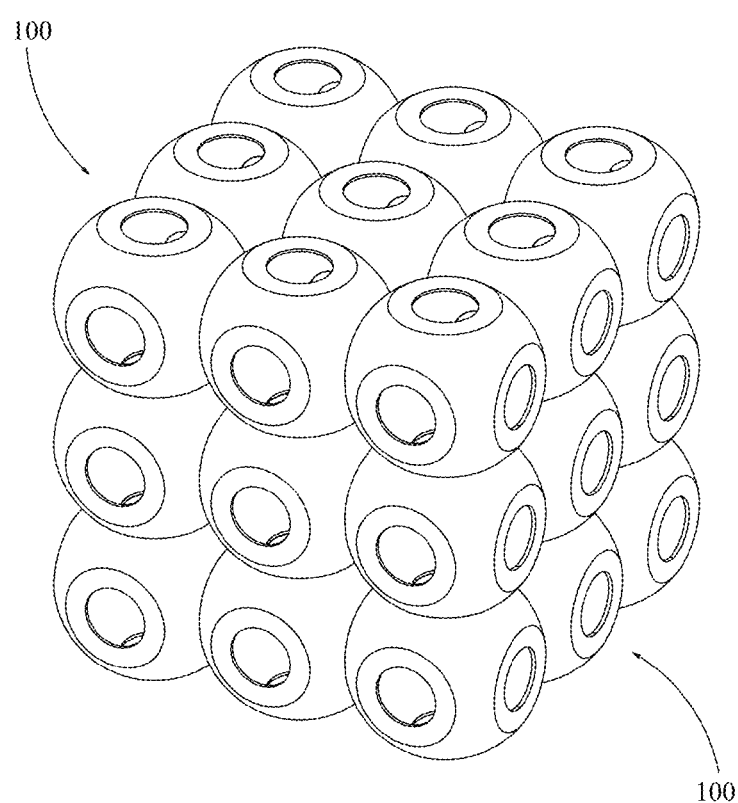
FIG. 4 is a perspective view of the first embodiment of the Simple Cubic (SC) lattice structure of the present invention constituted by the Simple Cubic (SC) tessellation of FIG. 3.

As shown in FIG. 4, a SC tessellation 100 of the present embodiment is propagated with periodic tessellation in three-dimensional design domain to form a Simple Cubic (SC) tessellated lattice structure 1000.

Referring to FIGS. 5, 6, 7 and 8, the second embodiment of a basic unit lattice cell of the present invention, the second embodiment of tessellation named as 'Body Centered Cubic (BCC) tessellation' of the present invention, and the second embodiment of a BCC tessellated lattice structure.

Figure 5:
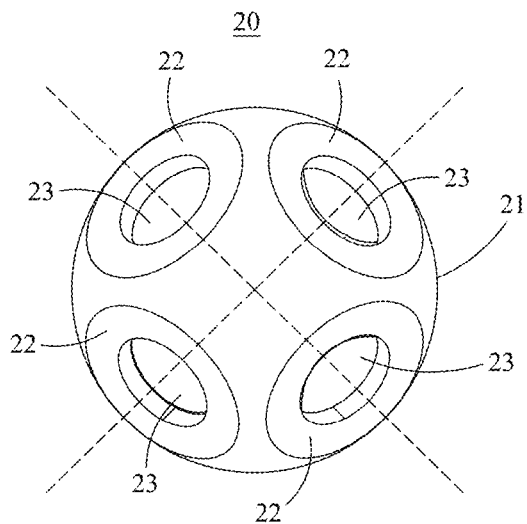
FIG. 5 is a perspective view of the second embodiment of a basic unit lattice cell of Body Centered Cubic (BCC) tessellation of the present invention.
Figure 6:
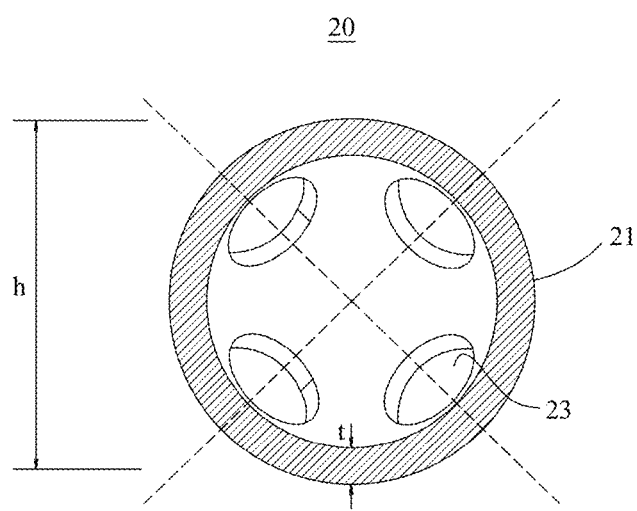
FIG. 6 is a cross section of the basic unit lattice cell of FIG. 5.

As shown in FIG. 5, the basic unit lattice cell 20 of the present embodiment includes a spherical body 21 and multiple flat connecting portions 22 designed on the surface of the spherical body 21. The flat connecting portions 22 is a plane formed on the spherical surface of the spherical body 21. The flat connecting portions 22 are intersected respectively with four mutually intersecting axes which extend through a center of the basic unit lattice cell 20 extend through the flat connecting portions 22. Each axis extends through center of two opposite flat connecting portions 22. The four mutually intersecting axes corresponds to four diagonal lines of a cubic design domain of basic unit lattice cell 20. Therefore, the basic unit lattice cell 20 of the present embodiment has totally eight flat connecting portions 22. The spherical body 21 of the basic unit lattice cell 20 is hollow, and the spherical member 20 further includes through holes 23 formed on the flat connecting portions 22 respectively. However, the through holes can be replaced with membranes of different thickness to close the basic unit lattice cell. Such closed unit lattice cells can be used in filling secondary filler materials (solid powders, liquid, gels, gas) to develop multi-material lattice structures. In the present embodiment, each flat connecting portion 22 has a through hole 23. As shown in FIG. 6, the basic unit lattice cell 20 has a height h defined by a distance from one end thereof to another opposite end thereof, and the height h ranges from 2 mm to 30 mm, i.e. 2 mm≤h≤30 mm. The spherical member 20 has a thickness t defined by a distance from an outer surface thereof to an inner surface thereof, and the thickness t ranges from 0.2 mm to 10 mm, i.e. 0.2 mm≤t≤10 mm.

Figure 7:
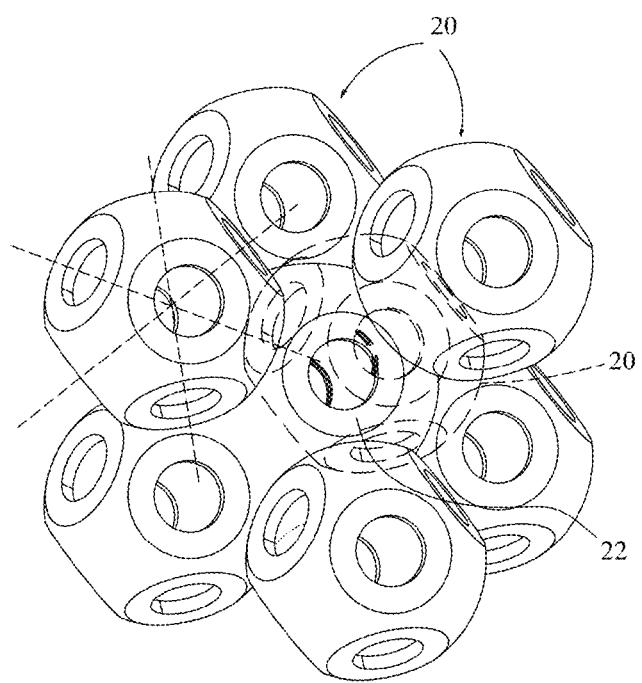
FIG. 7 is a perspective view of the second embodiment of Body Centered Cubic (BCC) tessellation of the present invention constituted by the basic unit lattice cell of FIG. 5.
Figure 8:
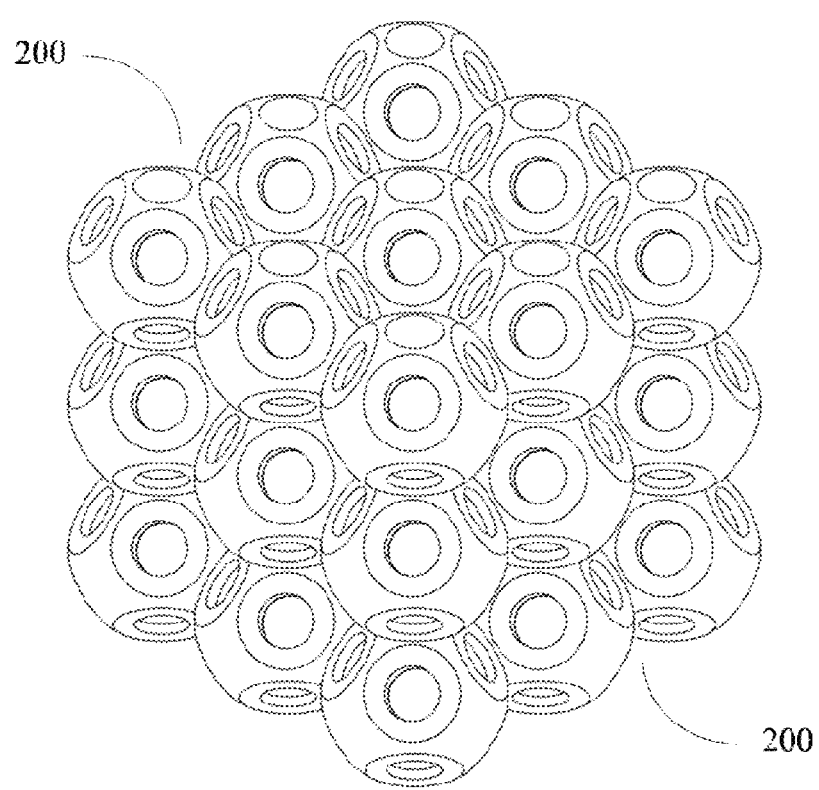
FIG. 8 is a perspective view of the second embodiment of a Body Centered Cubic (BCC) lattice structure of the present invention constituted by the Body Centered Cubic tessellation of FIG. 7.

As shown in FIG. 7, a multiple of basic unit lattice cell 20 of the present embodiment are stacked and tessellated to constitute BCC tessellation 200. As described above, each basic unit lattice cell 20 has flat connecting portions 22 intersecting with four mutually intersecting axes. The flat connecting portions 22 of one basic unit lattice cell 20 is connected to the flat connecting portions 22 of an adjacent basic unit lattice cell 20, whereby the two basic unit lattice cells 20 are connected to constitute a connection structure of edge-to-edge tessellation. In the present embodiment, each basic unit lattice cell 20 is connected to eight adjacent basic unit lattice cells 20 to constitute a BCC tessellation 200. The length of the tessellation is equal to two times the diameter of the basic unit lattice cell 20. The connection structure of the basic unit lattice cells 20 provides a larger connection area with the flat connecting portions 22 to enhance the strength of the connection interface. The size of the connection portions can be varied ranging from 0 mm (i.e. closed cells) to 'diameter of basic unit lattice cell 20. As shown in FIG. 8, BCC tessellation 200 of the present embodiment is propagated with periodic tessellation in three dimensional design domain to form a BCC tessellated lattice structure 2000.

Referring to FIGS. 9, 10, 11 and 12, the third embodiment of a basic unit lattice cell of the present invention, the third embodiment of tessellation named as 'Face Centered Cubic (FCC) tessellation' of the present invention, and the third embodiment of FCC tessellated lattice structure.

Figure 9:
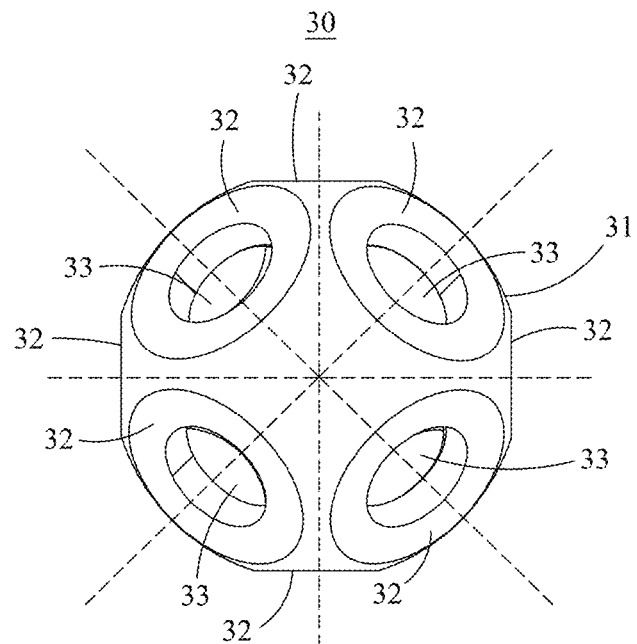
FIG. 9 is a perspective view of the third embodiment of the basic unit lattice cell of Face Centered Cubic (FCC) tessellation.
Figure 10:
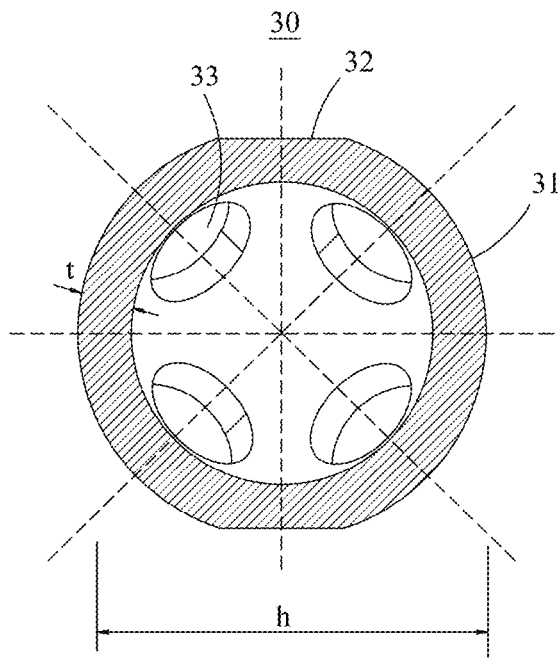
FIG. 10 is a cross section of the basic unit lattice cell of FIG. 9.

As shown in FIG. 9, the basic unit lattice cell 30 of the present embodiment includes a spherical body 31 and multiple flat connecting portions 32 disposed on the surface of the spherical body 31. The flat connecting portions 32 is a plane formed on the spherical surface of the spherical body 31. The flat connecting portions 32 are intersected respectively with six mutually intersecting axes which extend through a center of the basic unit lattice cell 30, and that is the six mutually intersecting axes extend through the flat connecting portions 32. Each axis extends through center of two opposite flat connecting portions 32. The six mutually intersecting axes correspond to four lines connecting the centroid of a square/rectangle surface of a cubic lattice structure where the basic unit lattice cell 30 is located to the centroids of the other four adjacent square/rectangle surfaces of the cubic lattice structure, and two diagonal lines of the square/rectangle surface where the basic unit lattice cell 30 is located. Therefore, the basic unit lattice cell 30 of the present embodiment has totally twelve flat connecting portions 32. The spherical body 31 of the basic unit lattice cell 30 is hollow, and the basic unit lattice cell 30 further includes through holes 33 formed on the flat connecting portions 32 respectively. In the present embodiment, the through holes 33 are only formed on the flat connecting portion 32 intersecting with the axes corresponding to the four lines connecting the centroid of a square design domain. The other two flat connecting portions 32 does not include through hole 33. Moreover, the through holes can be replaced with membranes of different thickness to close the basic unit lattice cell. Such closed unit lattice cells can be used in filling secondary filler materials (solid powders, liquid, gels, gas) to develop multi-material lattice structures. As shown in FIG. 10, the basic unit lattice cell 30 has a height h defined by a distance from one end thereof to another opposite end thereof, and the height h ranges from 2 mm to 30 mm, i.e. 2 mm≤h≤ 30 mm. The basic unit lattice cell 30 has a thickness t defined by a distance from an outer surface thereof to an inner surface thereof, and the thickness t ranges from 0.2 mm to 10 mm, i.e. 0.2 mm≤t≤10 mm.

Figure 11:
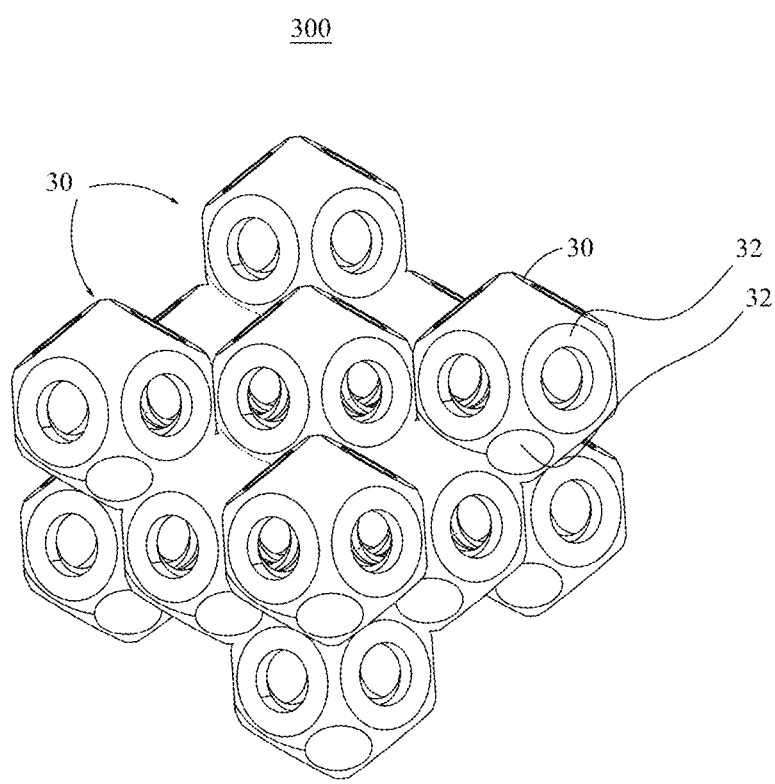
FIG. 11 is a perspective view of the third embodiment of the Face Centered Cubic (FCC) tessellation of the present invention constituted by the basic unit lattice cells of FIG. 9.
Figure 12:
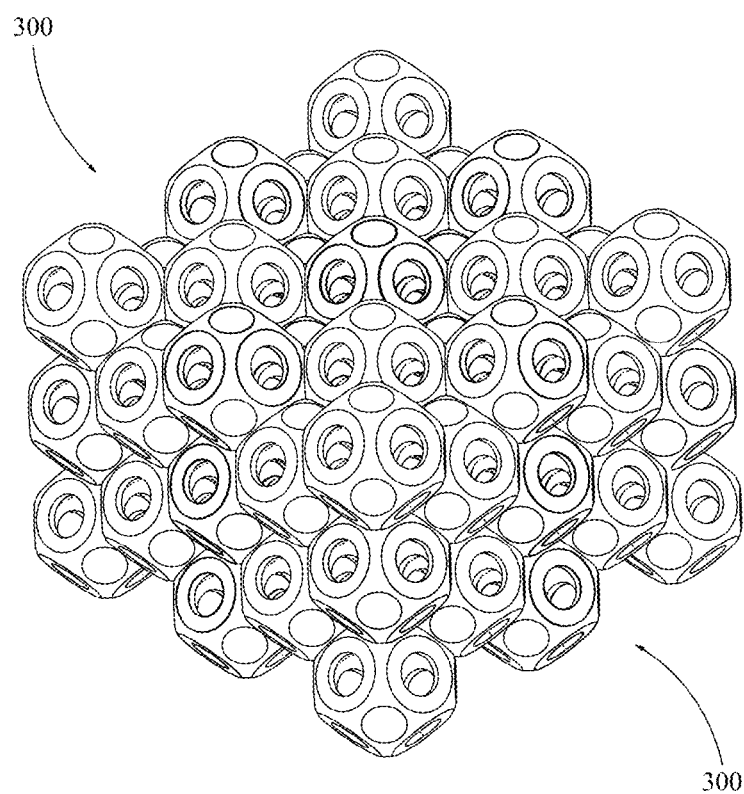
FIG. 12 is a perspective view of the third embodiment of the Face Centered Cubic (FCC) lattice structure of the present invention constituted by the Face Centered Cubic (FCC) tessellation of FIG. 11.

As shown in FIG. 11, multiple of basic unit lattice cell 30 of the present embodiment are stacked and tessellated to constitute FCC tessellation 300. As described above, each basic unit lattice cell 30 has flat connecting portions 32 intersecting with six mutually intersecting axes. The flat connecting portions 32 of one basic unit lattice cell 30 is connected to the flat connecting portions 32 of an adjacent basic unit lattice cell 30, whereby the two basic unit lattice cells 30 are connected to constitute a connection structure of edge-to-edge tessellation. In the present embodiment, each basic unit lattice cell 30 is connected to twelve adjacent basic unit lattice cells 30 to constitute FCC tessellation 300. o. The connection structure of the basic unit lattice cell 30 provides a larger connection area with the flat connecting portions 32 to enhance the strength of the connection interface. The size of the connection portions can be varied ranging from 0 mm (i.e. closed cells) to 'diameter of basic unit lattice cell 30. As shown in FIG. 12, FCC tessellation 300 of the present embodiment is propagated with periodic tessellation in three dimensional design domain to form FCC tessellated lattice structure 3000.

Figure 13:
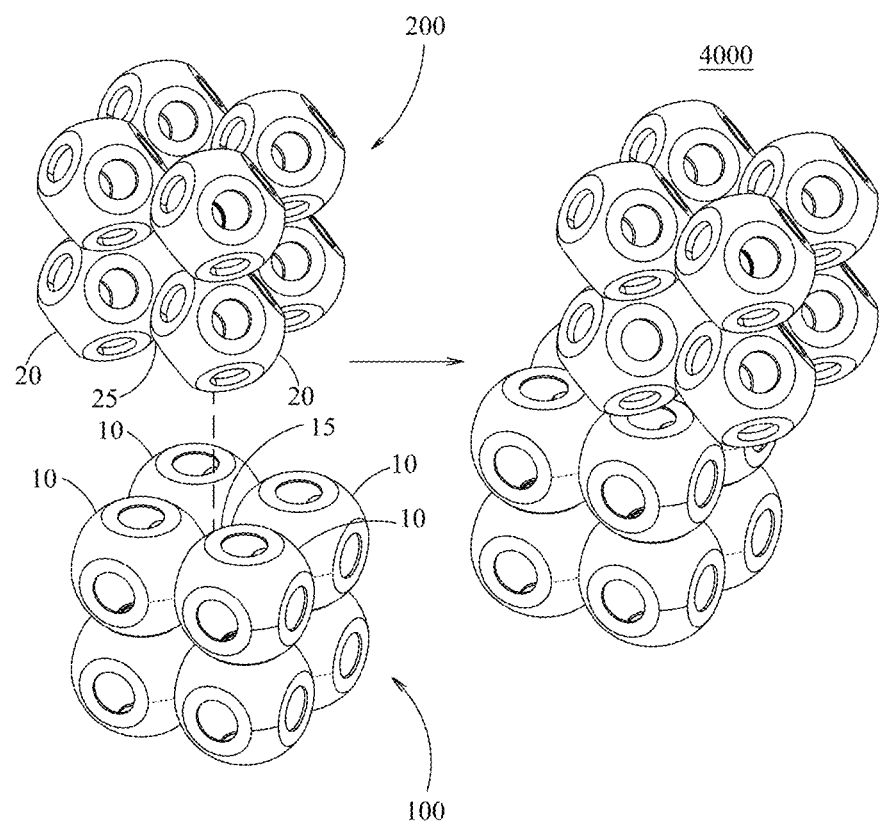
FIG. 13 is a perspective view of the fourth embodiment of the SC-BCC Functionally Tessellated (FT) lattice structure constituted by the first embodiment and the second embodiment of the tessellations.

Referring to FIG. 13, the SC tessellation 100 and the BCC tessellation 200 are stacked one above the other to constitute a SC-BCC Functionally Tessellated (FT) lattice structure 4000. Multiple basic unit lattice cells 10 of SC tessellation 100 are arranged to form a cavity portion 15, and multiple basic unit lattice cells 20 of BCC tessellation 200 are arranged to form a cavity portion 25. One basic unit lattice cell 20 of the BCC tessellation 200 engages the cavity portion 15 of the SC tessellation 100, and vice versa. Such arrangement would deliver SC-BCC Functionally Tessellated (FT) lattice structure 4000. The positions of SC tessellation 100 and BCC tessellation 200 can be interchanged in 4000 as per the requirement.

Figure 14:
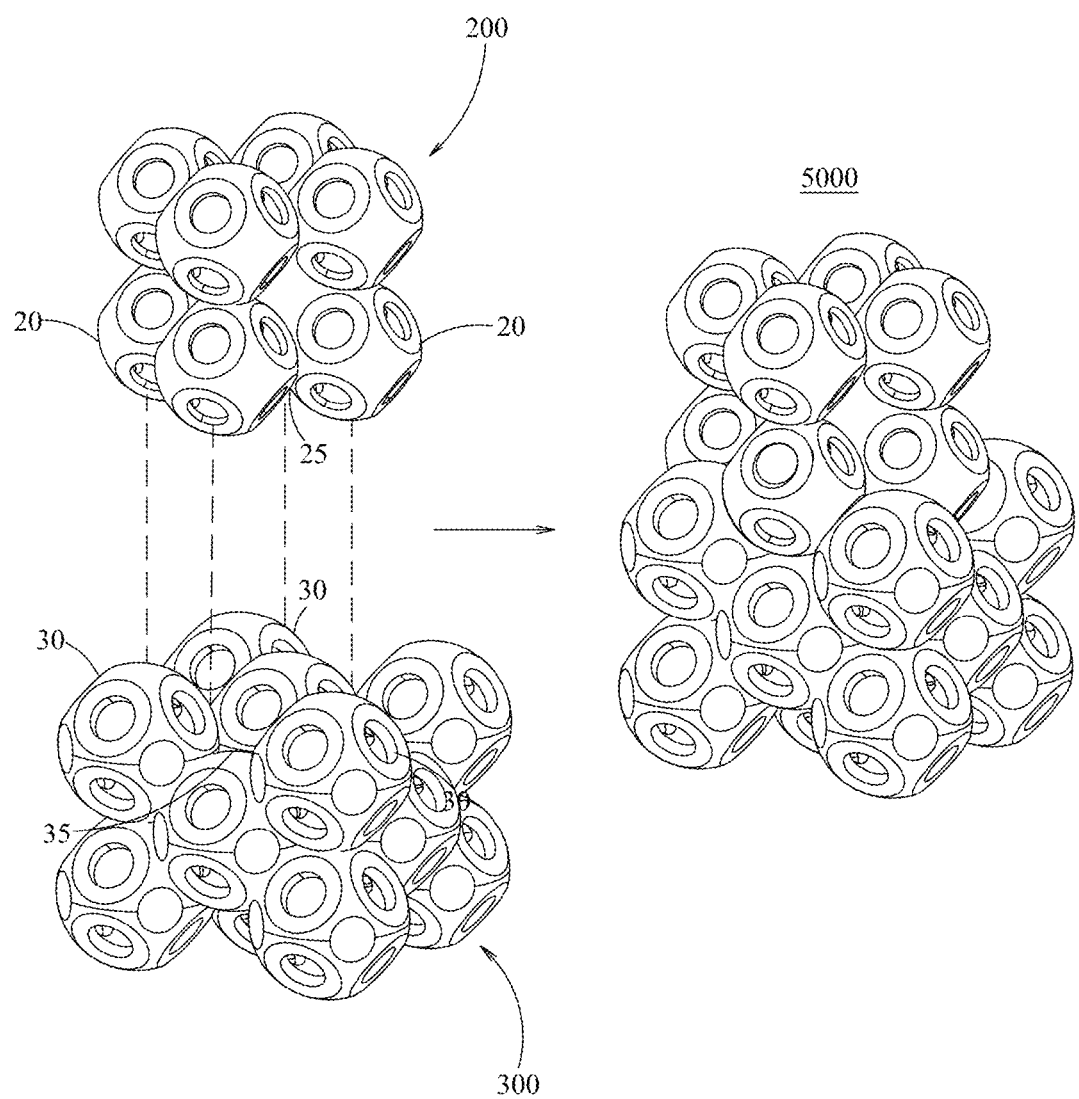
FIG. 14 is a perspective view of the fifth embodiment of the BCC-FCC Functionally Tessellated (FT) lattice structure constituted by the second embodiment and the third embodiment of the tessellations.

Referring to FIG. 14, BCC tessellation 200 and FCC tessellation 300 are stacked one above the other to constitute a BCC-FCC Functionally Tessellated (FT) lattice structure 5000. Multiple basic unit lattice cells 20 of the BCC tessellation 200 are arranged to form a cavity portion 25, and multiple basic unit lattice cells 30 of the FCC tessellation 300 are arranged to form a cavity portion 35. One basic unit lattice cell 30 of the FCC tessellation 300 engages the cavity portion 25 of the BCC tessellation 200, and vice versa. Such arrangement would deliver BCC-FCC Functionally Tessellated (FT) lattice structure 5000. The positions of BCC tessellation 200 and FCC tessellation 300 can be interchanged in 5000 as per the requirement.

Figure 15:
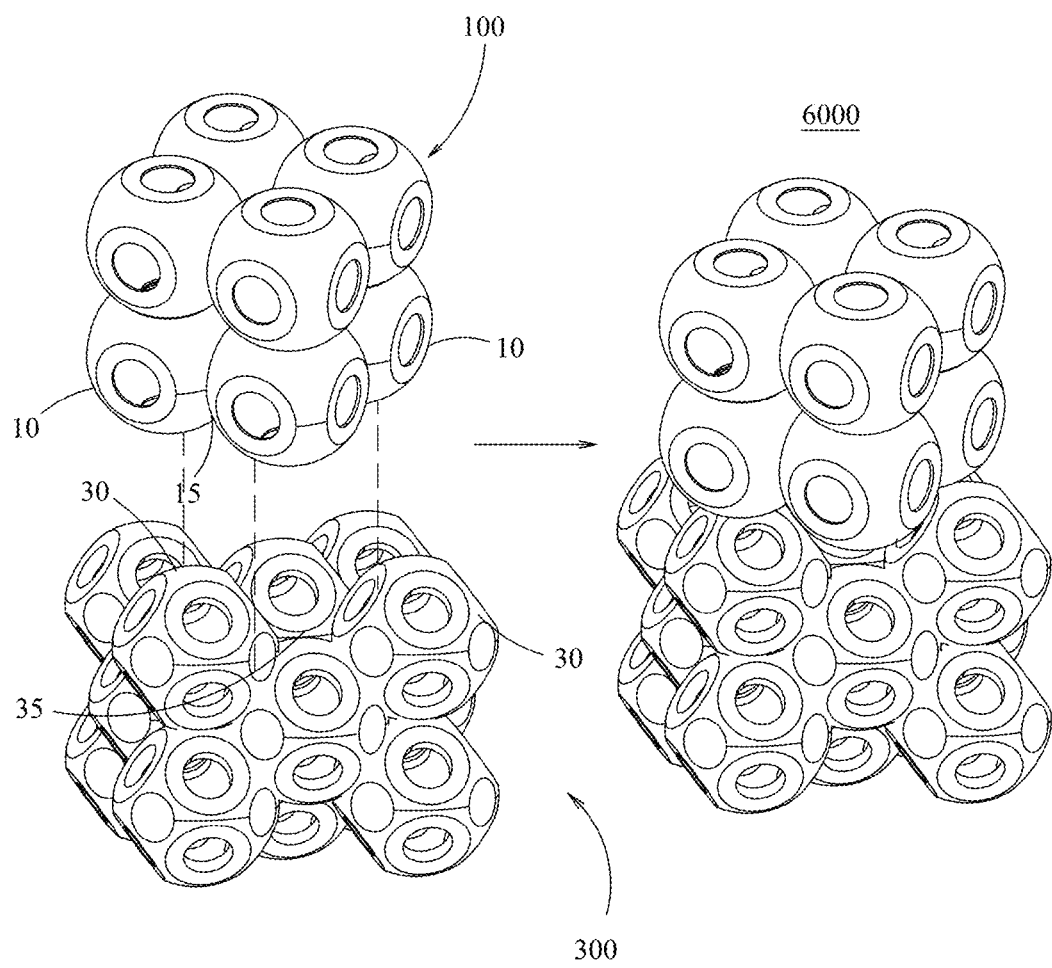
FIG. 15 is a perspective view of the sixth embodiment of the SC-FCC Functionally Tessellated (FT) lattice structure constituted by the first embodiment and the third embodiment of the tessellations.

Referring to FIG. 15, the SC tessellation 100 and the FCC tessellation 300 are stacked one above the other to constitute a SC-FCC Functionally Tessellated (FT) lattice structure 6000. Multiple basic unit lattice cells 10 of SC tessellation 100 are arranged to form a cavity portion 15, and multiple basic unit lattice cells 30 of FCC tessellation 300 are arranged to form a cavity portion 35. One basic unit lattice cell 30 of the FCC tessellation 300 engages the cavity portion 15 of the SC tessellation 100, and vice versa. Such arrangement would deliver SC-FCC Functionally Tessellated (FT) lattice structure 6000. The positions of SC tessellation 100 and FCC tessellation 300 can be interchanged in 6000 as per the requirement.

Figure 16:
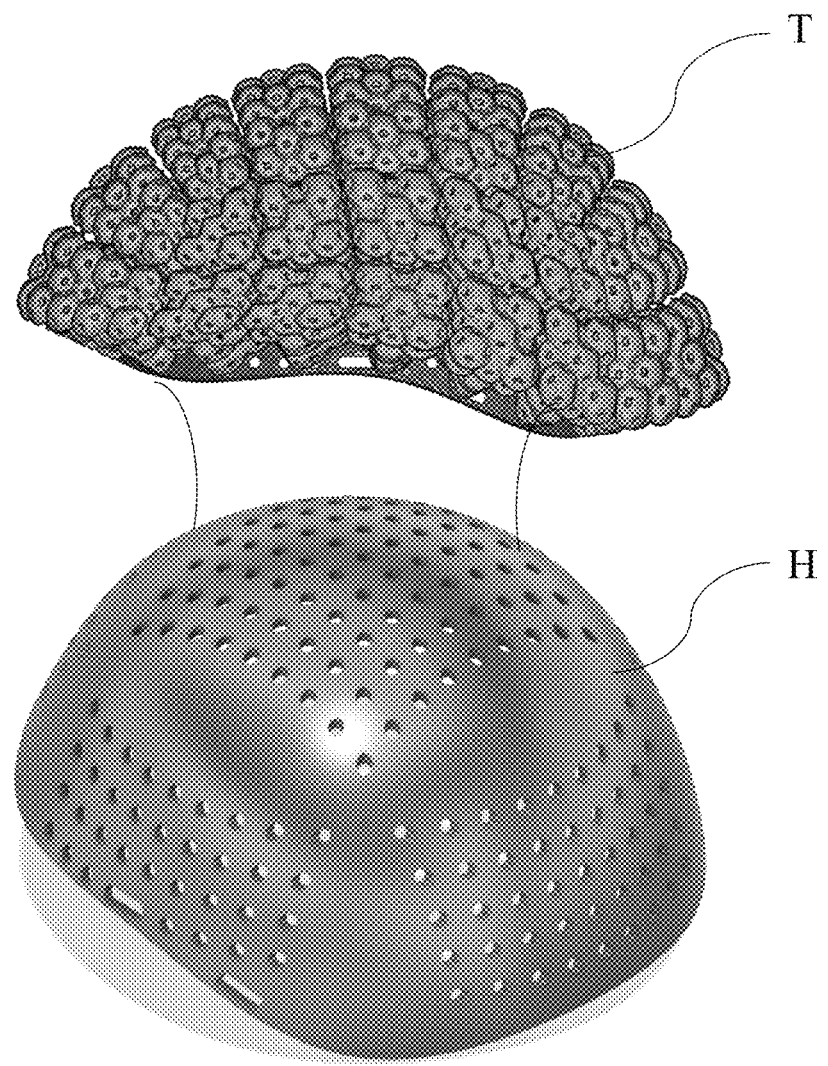
FIG. 16 is a schematic view of a helmet constituted by the SC-BCC-FCC Functionally Tessellated (FT) lattice structure of the present invention.

Referring to FIG. 16, the SC-BCC-FCC functionally tessellated lattice structure T of the present invention is constituted by SC, BCC and FCC tessellated lattice structures (i.e. 1000, 2000 and 3000). The design of T is used in personal protective equipment such as helmet H. The functionally tessellated lattice structure T provides hard and impact resistant properties in outer portion with FCC tessellated lattice structure 3000 and soft and cushioning properties in inner portion with SC tessellated lattice structure. BCC tessellated lattice structure 2000 would provide moderate strength and cushioning properties and thus serves as the connecting structure between SC and FCC tessellated lattice structures. This would protect the user from accidental impacts with comfortable and soft interior. The interior of the helmet H would not harm the user upon accidental impacts due to cushioning properties of SC tessellated lattice structure 1000.

Figure 17:
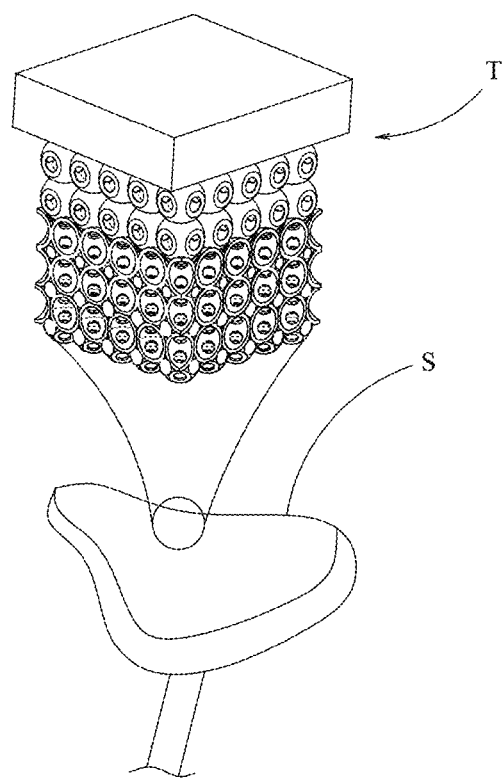
FIG. 17 is a schematic view of a bicycle saddle constituted by the SC-BCC-FCC Functionally Tessellated (FT) lattice of the present invention.

Referring to FIG. 17, the SC-BCC-FCC functionally tessellated lattice structure T of the present invention is constituted by SC, BCC and FCC tessellated lattice structures (i.e. 1000, 2000 and 3000). The design of T is applied to a bicycle saddle S. The top portion of the bicycle saddle S would constitute SC tessellated lattice structure 1000 that would provide cushioning to the user against shocks. While the FCC tessellated lattice structure 3000 at the bottom would deliver rigidity to the structure to withstand human load. BCC tessellated lattice structure 2000 would provide moderate strength and cushioning properties and thus serves as the connecting structure between SC and FCC tessellated lattice structures.

Figure 18:
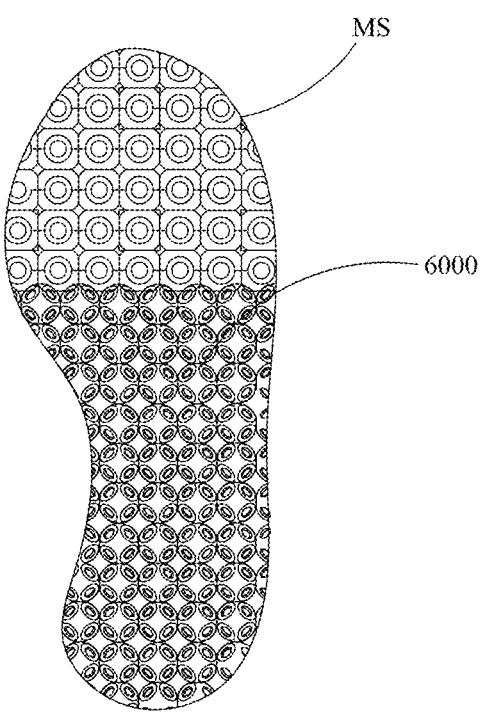
FIG. 18 is a schematic view of a shoe midsole based on multiple tessellations of the present invention.

Referring to FIG. 18, functionally tessellated structures such as SC-BCC, BCC-FCC or SC-FCC lattice structures represented here as T of the present invention can be applied to a shoe midsole MS. Shoe midsole MS requires different functional properties in frontal and heel portion based on types of shoes such as walking shoes, running shoes, hiking shoes, weight-lifting shoes, etc.

The different tessellated lattice structures: SC, BCC and FCC, can be stacked and tessellated to constitute an interlocked functionally tessellated lattice structure. For example, the combination of the simple cubic lattice structure and the body-centered cubic lattice structure, the combination of the body-centered cubic lattice structure and the face-centered cubic lattice structure, the combination of the simple cubic lattice structure and the face-centered cubic lattice structure, or the combination of simple cubic lattice structure, body-centered cubic lattice structure and face-centered cubic lattice structure arranged in any required order. The different tessellated lattice structures can be applied in different portions of a product for different requirements. Due to the interlocking mechanism of lattice structures, the behavior of functionally tessellated lattice structure resembles the properties delivered by multi-material or multi-morphology lattice structures.

Figure 19:
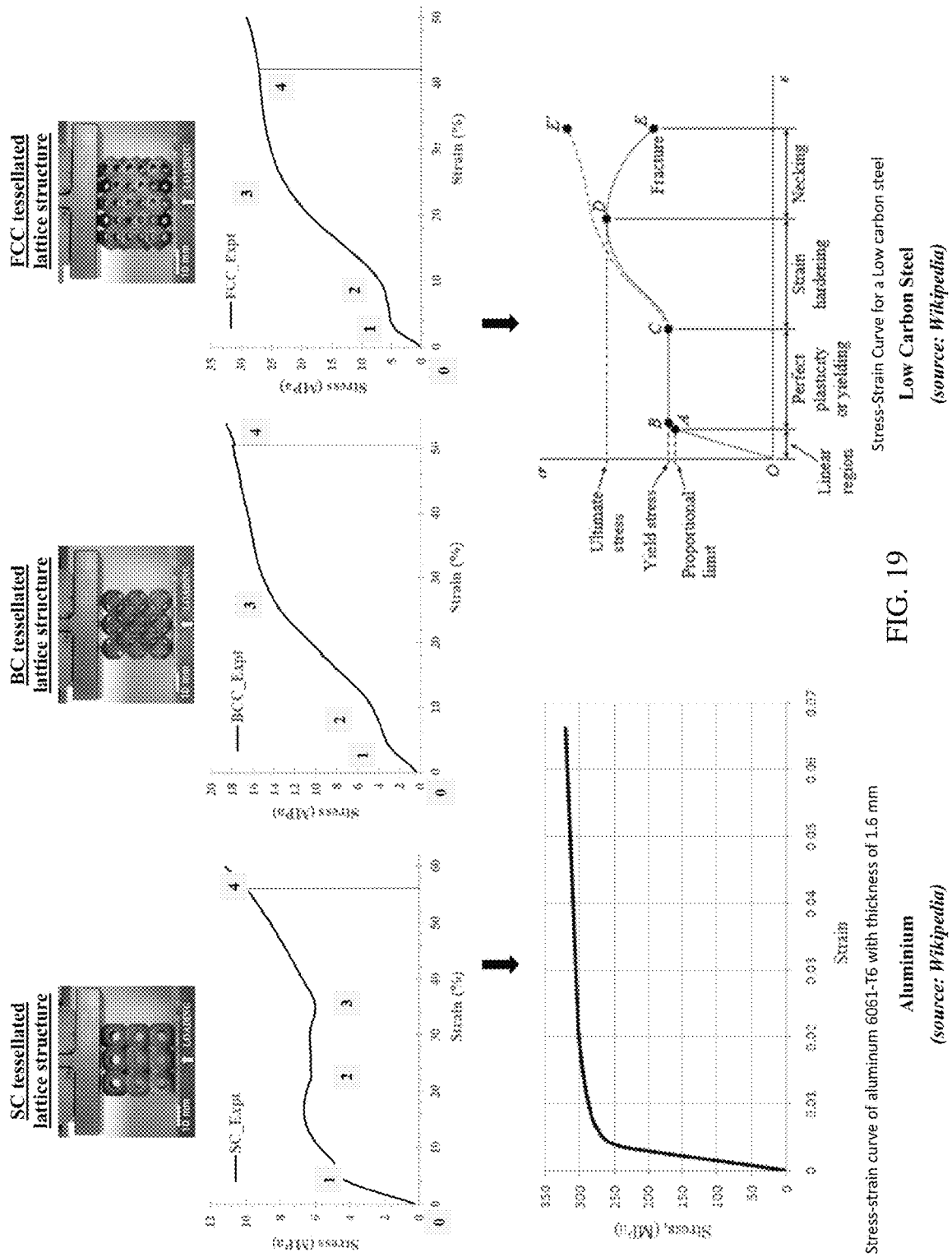
FIG. 19 is a schematic view of tessellated lattice structures printed with HP-MJF 3D printed and tested for compression properties. Different tessellated lattice structure behave is correlated with different material behavior thereby introducing the term 'Digital Metallurgy'.

Referring to FIG. 19, the designs of SC, BCC and FCC tessellated lattice structures were 3D printed with HP-MJF commercial 3D printer to analyze the results. Compression testing of the printed samples were carried out with MTS-810 universal testing machine. The compression behavior of three samples were different and unique. The stress vs. strain plots of all the samples were divided into 5 regions: 0-start of compression, 1-start of yielding, 2-incremental or decremental strength, 3-strengthening, 4-densification. The deformation behavior of SC tessellated lattice structure is correlated with the deformation of Aluminum alloy. Whereas, the behavior of BCC and FCC tessellated lattice structures are correlated with the deformation behavior of low carbon steel. Thus, the combination of these structures together would provide the behavior collective behavior resembling aluminum and low carbon steel. The concept behind this is termed as 'Digital Metallurgy' wherein, the material properties are generated by manipulating design of lattice structures. This would enable simulation based property generation which is clean, eco-friendly and sustainable way of getting different material properties.

Figure 20:
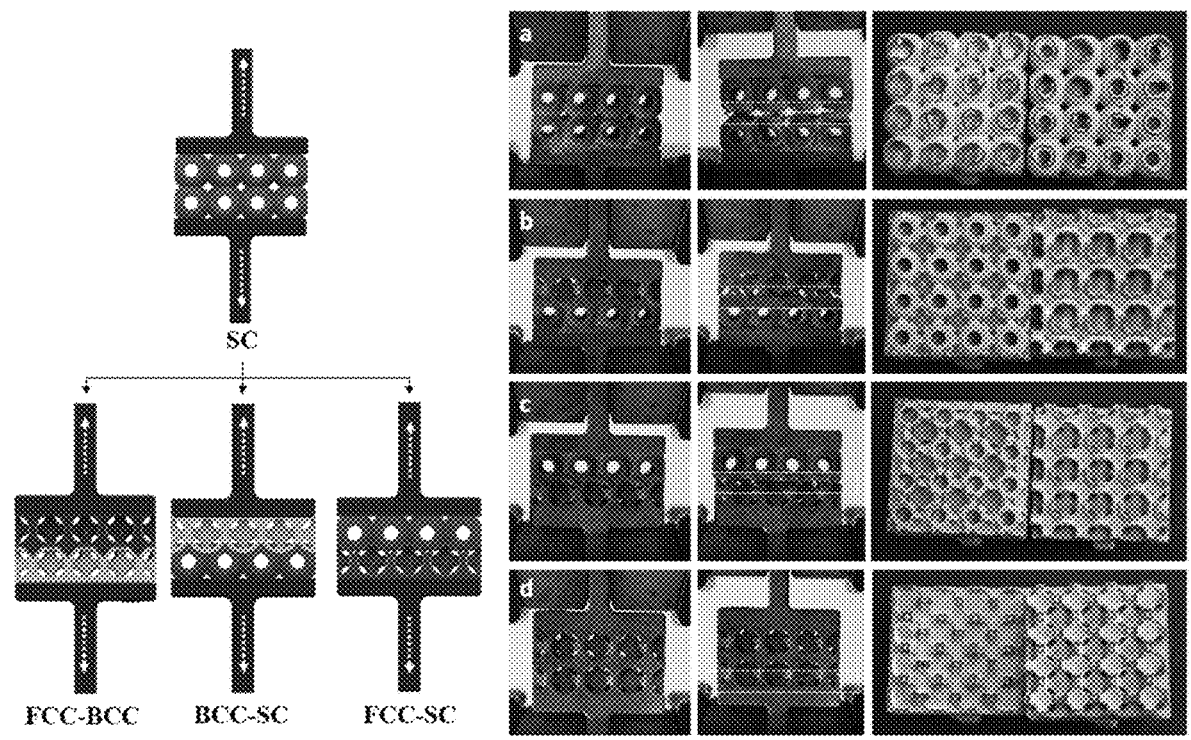
FIG. 20 is a schematic view of experimentation carried out to check the possible delamination of functional tessellations.

Referring to FIG. 20, the interface strength of the different functionally graded lattice structures: SC-BCC, BCC-FCC and SC-FCC were studied and compared with the interface strength of SC tessellated lattice structure. The study was carried out to observe the possible interface delamination which is major issue of failure in multi-material lattice structures. The study proves that there is no delamination being observed between two different tessellated lattice structures.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A metallic crystal structure inspired lattices with Body Centered Cubic (BCC) and Face Centered Cubic (FCC) tessellations, comprising of multiple basic unit lattice cells stacked and connected to constitute a three-dimensional lattice structures, wherein morphology of basic unit lattice cell is inspired by a shape of urchin, and each of basic unit lattice cells of different tessellations comprises multiple flat connecting portions formed on a surface of a basic unit lattice cell and intersecting with axes generated from the center of the basic unit lattice cell, and the flat connecting portions of one of the basic unit lattice cell is connected to the flat connecting portions of an adjacent basic unit lattice cell to constitute a connection structure of edge-to-edge tessellation; wherein the flat connecting portions are intersected with four axes corresponding to four diagonal lines of a cubic lattice in which the basic unit lattice cell of BCC is located, and the three-dimensional tessellation being generated is Body Centered Cubic (BCC) tessellation, or the flat connecting portions are intersected with six axes corresponding to four lines connecting a centroid of a cubic/rectangle surface of a cubic lattice where the basic unit lattice cell is located to centroids of other four adjacent cubic/rectangle surfaces of the cubic lattice and two diagonal lines of the cubic/rectangle surface where the basic unit lattice cell is located, and the three-dimensional lattice structure being generated is Face Centered Cubic (FCC) lattice structure.

2. The metallic crystal structure inspired lattices as claimed in claim 1, wherein the basic unit lattice cells are hollow and each of the basic unit lattice cell further comprises of through holes formed on at least one of the connecting portions.

3. The metallic crystal structure inspired lattices as claimed in claim 1, wherein through holes on the surface of basic unit lattice cell can be replaced with membrane of varied thickness to close it, and the closed basic unit lattice cells can be filled with secondary filler materials.

4. The metallic crystal structure inspired lattices as claimed in claim 1, wherein the basic unit lattice cell has a height h defined by a distance from one end thereof to another opposite end thereof, and the height h ranges from 2 mm to 30 mm, and a spherical member has a thickness t defined by a distance from an outer surface thereof to an inner surface thereof, and the thickness t ranges from 0.2 mm to 10 mm.

5. The metallic crystal structure inspired lattices as claimed in claim 1, wherein the flat connecting portions of the basic unit lattice cells are joined together to form tessellations comprising: Body Centered Cubic (BCC) tessellation and Face Centered Cubic (FCC) tessellations, and in the tessellations, the basic unit lattice cells have identical mechanical or/and chemical properties as the adjacent basic unit lattice cells or has different mechanical or/and chemical properties from the adjacent basic unit lattice cells.

6. The metallic crystal structure inspired lattices as claimed in 1, wherein the basic unit lattice cells may change their morphology from uniform cubic design domain to non-uniform tetragonal design domain in any orientation as per the properties requirement.

7. The metallic crystal structure inspired lattices as claimed in claim 5, wherein the Body Centered Cubic (BCC) tessellated lattice structure, the Face Centered Cubic (FCC) tessellated lattice structure, comprising respective tessellations stacked and periodically tessellated, wherein each of the tessellation comprises a multiple basic unit lattice cells stacked and connected to constitute a three-dimensional lattice structure, wherein each of the basic unit lattice cell comprises a multiple flat connecting portions formed on a surface of the basic unit lattice cell and intersecting with a multiple axes intersecting in a center of the basic unit lattice cell, and the flat connecting portions of one of the basic unit lattice cell is connected to the flat connecting portions of the adjacent basic unit lattice cell to constitute a connection structure of edge-to-edge tessellation.

8. The metallic crystal structure inspired lattices as claimed in claim 1, wherein Body Centered Cubic (BCC) and Face Centered Cubic (FCC) tessellations are stacked and propagated in design domain to configure a Functionally Tessellated (FT) lattice structure comprising BCC-FCC.

9. The metallic crystal structure inspired lattices as claimed in claim 8, wherein the Functionally tessellated (FT) lattice structures comprises a first tessellation and a second tessellation stacked and tessellated with a first lattice-like additive manufacturing unit structure, wherein the first lattice-like additive manufacturing unit structure is a body-centered cubic packing structure or a face-centered cubic packing structure, and the second lattice-like additive manufacturing unit structure is a body-centered cubic packing structure or a face-centered cubic packing structure.

10. The metallic crystal structure inspired lattices as claimed in claim 8, wherein the first tessellation comprises a first cavity portion formed by a multiple of basic unit lattice cells, and the second tessellation comprises a second cavity portion formed by multiple of basic unit lattice cells, and one of the basic unit lattice cell of the second tessellation is placed into the first cavity portion, and one of the basic unit lattice cell of the first tessellation is placed into the second cavity portion, and this forms interlocking of structures at interface; the tessellation could be BCC or FCC and the second tessellation should be other than the first tessellation.

11. The metallic crystal structure inspired lattices as claimed in claim 8, wherein the first tessellation, the second tessellation and/or the third tessellation have different mechanical or/and chemical properties or/and functional properties.

* * * * *